US005734378A

United States Patent [19]

Okada et al.

[11] Patent Number: 5,734,378

[45] Date of Patent: Mar. 31, 1998

[54] APPARATUS AND METHOD FOR TRANSFERRING IMAGE DATA TO DISPLAY DRIVER IN A TIME SERIES FORMAT TO REDUCE THE NUMBER OF REQUIRED INPUT TERMINALS TO THE DRIVER

[75] Inventors: Hisao Okada, Ikoma-gun; Yuji Yamamoto, Kobe; Takeshi Takarada, Tenri, all of Japan

[73] Assignee: Sharp Kabushiki Kaisha, Osaka, Japan

[21] Appl. No.: 326,841

[22] Filed: Oct. 21, 1994

[30] Foreign Application Priority Data

Oct. 28, 1993 [JP] Japan .................................... 5-271043

[51] Int. Cl.$^{6}$ ............................... G09G 5/00; H03M 9/00

[52] U.S. Cl. .......................... 345/204; 341/100; 341/101; 345/155

[58] Field of Search .................................. 345/55, 84, 88, 345/94, 98, 99, 100, 204, 103, 132, 155, 200, 203; 341/100, 101

[56] References Cited

U.S. PATENT DOCUMENTS

| | | | |
|---|---|---|---|
| 3,787,834 | 1/1974 | Elliott | 345/103 |
| 4,149,151 | 4/1979 | Nagae et al. | 345/98 |
| 4,740,786 | 4/1988 | Smith | 345/103 |
| 4,745,485 | 5/1988 | Iwasaki | 345/98 |
| 5,151,689 | 9/1992 | Kabuto et al. | 345/103 |
| 5,162,786 | 11/1992 | Fukuda | 345/100 |
| 5,227,790 | 7/1993 | Shin et al. | 341/100 |
| 5,373,310 | 12/1994 | Ichimura et al. | 345/33 |
| 5,426,447 | 6/1995 | Lee | 345/103 |
| 5,523,773 | 6/1996 | Arakawa et al. | 345/103 |
| 5,537,128 | 7/1996 | Keene et al. | 345/98 |

FOREIGN PATENT DOCUMENTS 5-216437 8/1993 Japan .

OTHER PUBLICATIONS

VDO–Querschnitt. VDO Adolf Schindling AG., Schwalbach/Ts., edition 6 of Mar. 1983, pp. 19–22 (no translation).
Die Anzeigen (Displays). In: Funkschau 20/1985, pp. 59 and 60 (no translation).
Display Devices. In: Electronic Engineering, issued Apr. 1985, pp. 104–135.

*Primary Examiner*—Richard Hjerpe
*Assistant Examiner*—Paul A. Bell
*Attorney, Agent, or Firm*—Nixon & Vanderhye P.C.

[57] ABSTRACT

The display driving device of the invention has a display driver for driving a display device by using image data to perform a display. The display driving device includes: a time-series data generating section for arranging division data obtained by dividing the image data in a time-series manner, to generate time-series data; and transmission lines provided between the time-series data generating section and the display driver through which the time-series data is transmitted from the time-series data generating section. When the display area of the display device is divided into a plurality of display areas, a plurality of display drivers are provided.

10 Claims, 13 Drawing Sheets

APPARATUS AND METHOD FOR TRANSFERRING IMAGE DATA TO DISPLAY DRIVER IN A TIME SERIES FORMAT TO REDUCE THE NUMBER OF REQUIRED INPUT TERMINALS TO THE DRIVER

BACKGROUND OF THE INVENTION

1. Field of the Invention

The present invention relates to a display driving device used in a display apparatus and the like which necessitates a driving LSI referred to as a driver for driving the display such as a liquid crystal display device, an EL display device, and the like. The present invention also relates to a data transmission method used in the display driving device.

2. Description of the Related Art

In the conventional data transmission method used in a display driving device, a method in which image data is transmitted to a driver in the form of digital signals is used.

FIG. 9 shows a schematic diagram of data and a synchronization clock (a sampling clock) which is synchronized with the data in a conventional display driving device. To the display driving device, image data is applied in such a manner that data related to respective one of red (R), green (G), and blue (B) is represented by 8 bits. Herein, the present invention is not directly concerned with a scanning driver (a gate driver), other control signals, and a power supply, so that they are omitted in the description and the drawings.

In FIG. 9, an electronic computer 1 outputs display data such as image data of red (R), green (G), and blue (B) and a synchronization clock. The image data related to respective one of red (R), green (G), and blue (B) is represented by 8 bits. The electronic computer 1 is connected to a control circuit 3. The control circuit 3 performs the control so as to sort the display data into two sets of display data for upper and lower sections of a display screen of a liquid crystal display device 2. The control circuit 3 is connected to an upper-side driver 5 provided on an upper-side driver substrate 4 and a lower-side driver 7 provided on a lower-side driver substrate 6 via transmission line sets 8 and 9, respectively. The upper-side driver 5 and the lower-side driver 7 are connected to the display device 2.

With the above-described construction, the image data of red (R), green (G), and blue (B) each in 8 bits fed to the control circuit 3 together with the synchronization clock from the electronic computer 1 is sorted into two sets of data for the upper-side driver 5 and the lower-side driver 7 by the control circuit 3. The two sets of data are transmitted to the upper-side driver 5 and the lower-side driver 7 via the transmission line sets 8 and 9, respectively. Specifically, in each of the transmission line sets 8 and 9 from the control circuit 3 to the drivers 5 and 7, a line is provided per bit. For example, in a driving circuit using 8-bit data for each of R, G, and B, it is necessary to provide 24 lines only for the image data of red (R), green (G), and blue (B). It is appreciated that, in the cases where a driver is installed on either of the upper side or the lower side, the signal sorting by the control circuit 3 is not performed.

FIG. 10 shows transmission timings of a synchronization clock CK and image data AR, AG, and AB which are transmitted from the control circuit 3 to the upper-side driver 5 in FIG. 9. The transmission timings to the lower-side driver 7 are shown in the same way as in the case of the upper-side driver 5, so that the following description is made only for the upper-side driver 5.

In FIG. 10, numbers attached after the image data AR, AG, and AB indicate the transmission sequence of image data for each color transmitted to the upper-side driver 5. For example, AR1 designates the first transmitted data of red, and AR2 designates the second transmitted data of red. The respective image data AR, AG, and AB are sequentially fed for respective periodic rising edge of the synchronization clock CK.

FIG. 11 shows the connections of the transmission line set 8 provided between the control circuit 3 and the driver 5 in FIG. 9. In the actual driving section, the transmission line set 8 includes a plurality of parts such as line portions on a control circuit board, connectors, electric wires, and line portions on the driver substrate 4. In FIG. 11, the plurality of the parts are collectively shown. In general, it is necessary to use a plurality of drivers 5, and the transmission line set 8 is connected to input terminals ($R_0$–$R_7$, $G_0$–$G_7$, and $B_0$–$B_7$) of each of the plurality of drivers 5. FIG. 11 shows the connection of line set 8 only for one of such drivers 5. For the 8-bit image data AR (input terminals $R_0$–$R_7$), AG (input terminals $G_0$–$G_7$), and AB (input terminals $B_0$–$B_7$) of red (R), green (G), and blue (B), a line is provided per bit. Accordingly, 25 lines in total are required for the image data and the synchronization clock CK.

FIG. 12 shows circuitry of a data input portion of the driver 5 shown in FIG. 9. In FIG. 12, input terminals $TR_0$–$TR_7$, $TG_0$–$TG_7$, and $TB_0$–$TB_7$ into which the 8-bit image data AR (input terminals $R_0$–$R_7$), AG (input terminals $G_0$–$G_7$), and AB (input terminals $B_0$–$B_7$) of red (R), green (G), and blue (B) are input are respectively connected to input terminals $D_0$–$D_7$ of latch circuits 12 such as D-type flip-flops for respective colors via an input buffer 11. Output terminals $Q_0$–$Q_7$ of these latch circuits 12 are connected to internal bus IR for red, internal bus IG for green, and internal bus IB for blue, respectively. Input terminal TCK to which the synchronization clock CK is input is connected to a line for internal synchronization clock ICK via the input buffer 11, and the line for the internal synchronization clock ICK is connected to clock input terminals of the latch circuits 12 via an inverter 13.

The image data AR (input terminals $R_0$–$R_7$), AG (input terminals $G_0$–$G_7$), and AB (input terminals $B_0$–$B_7$) which are transmitted through the 24 data lines are data-latched by the latch circuits 12 for respective colors in accordance with the inverted synchronization clock which is obtained via the inverter 13. After the phases are matched with the transmission timings again, the image data are transmitted to desired portions in the driver 5. FIG. 13 shows the timings of the internal synchronization clock ICK and the internal image data IR, IG, and IB in the driver 5. As shown in FIG. 13, at respective periodic rising edges of the internal synchronization clock ICK, the respective internal image data IR, IG, and IB are sequentially transmitted.

According to the conventional method in which a transmission line is provided per bit of image data, in an exemplary case where image data for respective one of red (R), green (G), and blue (B) is represented by 3 bits, only nine transmission lines are required in total. However, in the above-described case where image data for respective one of red (R), green (G), and blue (B) is represented by 8 bits, 24 data lines are required in total. That is, the number of lines is increased by 15 as compared with the case of 3-bit image data. The data lines are connected to the driver 5, for example, through the driver substrate 4, and the width of the substrate 4 is desired to be as small as possible. The reason is described below. The driver substrates 4 are connected on both sides of the display device 2. If each substrate has a large width, the size of the resultant module is considerably large. As a matter of fact, the number of transmission lines is required to be as small as possible. The increase in number of data lines of the transmission line set 8 by 15 as in the case of 8-bit image data may be a critical problem for some purposes of the module. For example, in the case of the note-type electronic computer, the size is critical.

As for the driver itself, the increase in number of data lines by 15 as compared with the case of 3-bit image data results in a considerable increase in number of input terminals. Thus, the pitch of the input terminals is extremely small, which causes a difficulty of installation.

Table 1 below shows an example of the number and the pitch of input terminals of an actual driver for 3-bit image data which is installed in a film-like package (i.e., a so-called tape carrier package). The width of the driver is determined by the size of the display device, so that the width of the driver cannot be increased even if the driver is designed for 8-bit image data. Table 2 below shows an example of the number and the pitch of input terminals of an actual driver for 8-bit image data which is installed in a package having the same size as that in the 3-bit case. Herein, when the driver is designed for 8-bit data, the number of gray-scale power supplies is 9, and the numbers of other signals are the same as those in the 3-bit case.

TABLE 1

| | |
|---|---|
| Clock | 1 |
| Data input | 9 |
| Gray-scale power supply | 8 |
| Driving power supply | 4 |
| Control signal, etc. | 9 |
| Total number of input-side terminals | 31 |
| Pitch of input-side terminals | 0.08 mm |

TABLE 2

| | |
|---|---|
| Clock | 1 |
| Data input | 24 |
| Gray-scale power supply | 9 |
| Driving power supply | 4 |
| Control signal, etc. | 9 |
| Total number of input-side terminals | 47 |
| Pitch of input-side terminals | 0.52 mm |

As shown in the tables, in the case of the 8-bit data, the pitch of terminals is extremely reduced. In practice, this makes it difficult to perform automatic soldering by a machine for mass production. In addition, the width of each terminal is reduced, so that the mechanical strength is also reduced. Because of these facts, such devices are difficult to be commercially available, and the production cost thereof is significantly increased. Moreover, the size of the driver substrate is inevitably increased, so that the module using a driver for 8-bit data cannot be realized in the same size as that of the module using a driver for 3-bit data. This adversely affects the quality of the product.

SUMMARY OF THE INVENTION

The display driving device of this invention has a display driver for driving a display device by image data to perform a display. The display driving device includes: a time-series data generating section for arranging division data obtained by dividing the image data in a time-series manner, to generate time-series data; and transmission lines provided between the time-series data generating section and the display driver through which the time-series data is transmitted from the time-series data generating section.

According to another aspect of the invention, the display driving device has a display driver for driving a display device by image data to perform a display. The display driving device includes: a time-series data generating section for arranging division data obtained by dividing the image data in a time-series manner, to generate time-series data; transmission lines provided between the time-series data generating section and the display driver through which the time-series data is transmitted from the time-series data generating section; and an image data demodulating section provided in the display driver, for receiving the time-series data from the transmission lines and for reconstructing the image data from the time-series data.

In one embodiment of the invention, the image data demodulating section includes: a first flip-flop for receiving an inverted synchronization clock and time-series data and for latching the time-series data at the inverted synchronization clock, to acquire respective lower-bit data of the image data; a second flip-flop for receiving a synchronization clock and the time-series data and for latching the time-series data at the synchronization clock, to acquire respective upper-bit data of the image data; and a third flip-flop for receiving the inverted synchronization clock and the time-series data and for latching the upper-bit data from the second flip-flop at the inverted synchronization clock, to acquire respective upper-bit data of the image data.

In another embodiment of the invention, the image data demodulating section includes: a first flip-flop for receiving a first synchronization clock which applies a latch timing of upper-bit data and time-series data and for latching the time-series data at the first synchronization clock, to acquire respective upper-bit data of the image data; a second flip-flop for receiving a second synchronization clock which applies a latch timing of lower-bit data and the time-series data and for latching the time-series data at the second synchronization clock, to acquire respective lower-bit data of the image data; and a third flip-flop for receiving the second synchronization clock and the time-series data and for latching the upper-bit data from the first flip-flop at the second synchronization clock, to acquire respective upper-bit data of the image data.

According to another aspect of the invention, the display driving device has a display driver for driving a display device by image data composed of a plurality of bits to perform a display. The display driving device includes: a time-series data generating section for dividing the plurality of bits of the image data into pairs each including at least an upper bit and a lower bit and for arranging the upper bit and the lower bit in a time-series manner for each of the pairs, to generate time-series data; and transmission lines provided between the time-series data generating section and the display driver through which the time-series data is transmitted from the time-series data generating section.

In one embodiment of the invention, the time-series data generating section includes at least one set of logic portion including: a first AND gate receiving upper-bit data and a synchronization clock; a second AND gate receiving lower-bit data and an inverted synchronization clock; and an OR gate receiving outputs of the first and the second AND gates.

In another embodiment of the invention, the plurality of bits are 8 bits, the 8 bits being $D_0$ to $D_7$, the 8 bits being divided into an upper-bit set of $D_4$ to $D_7$ and a lower-bit set of $D_0$ to $D_3$, and the bits in the upper-bit set and the lower-bit set are arranged into pairs of: $D_0$ and $D_4$; $D_1$ and $D_5$; $D_2$ and $D_6$; and $D_3$ and $D_7$.

In the above-mentioned display driving devices, the display device may be divided into a plurality of display areas, and in Such a case, a plurality of the display drivers are provided in order to drive the display areas.

According to another aspect of the invention, a data transmission method is provided. The data transmission method is used for a display driving device having a display driver for driving a display device by image data composed of a plurality of bits to perform a display, wherein the plurality of bits of the image data are divided into pairs each including at least an upper bit and a lower bit and the upper bit and the lower bit are arranged in a time-series manner for each of the pairs, and the time-series data for each pair is transmitted through a transmission line.

Thus, the invention described herein makes possible the advantages of (1) providing a display driving device which can be mass-produced in which the increase in number of data lines and the increase in number of input terminals of a driver as the number of bits is increased can be suppressed, and (2) providing a data transfer method used in the device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
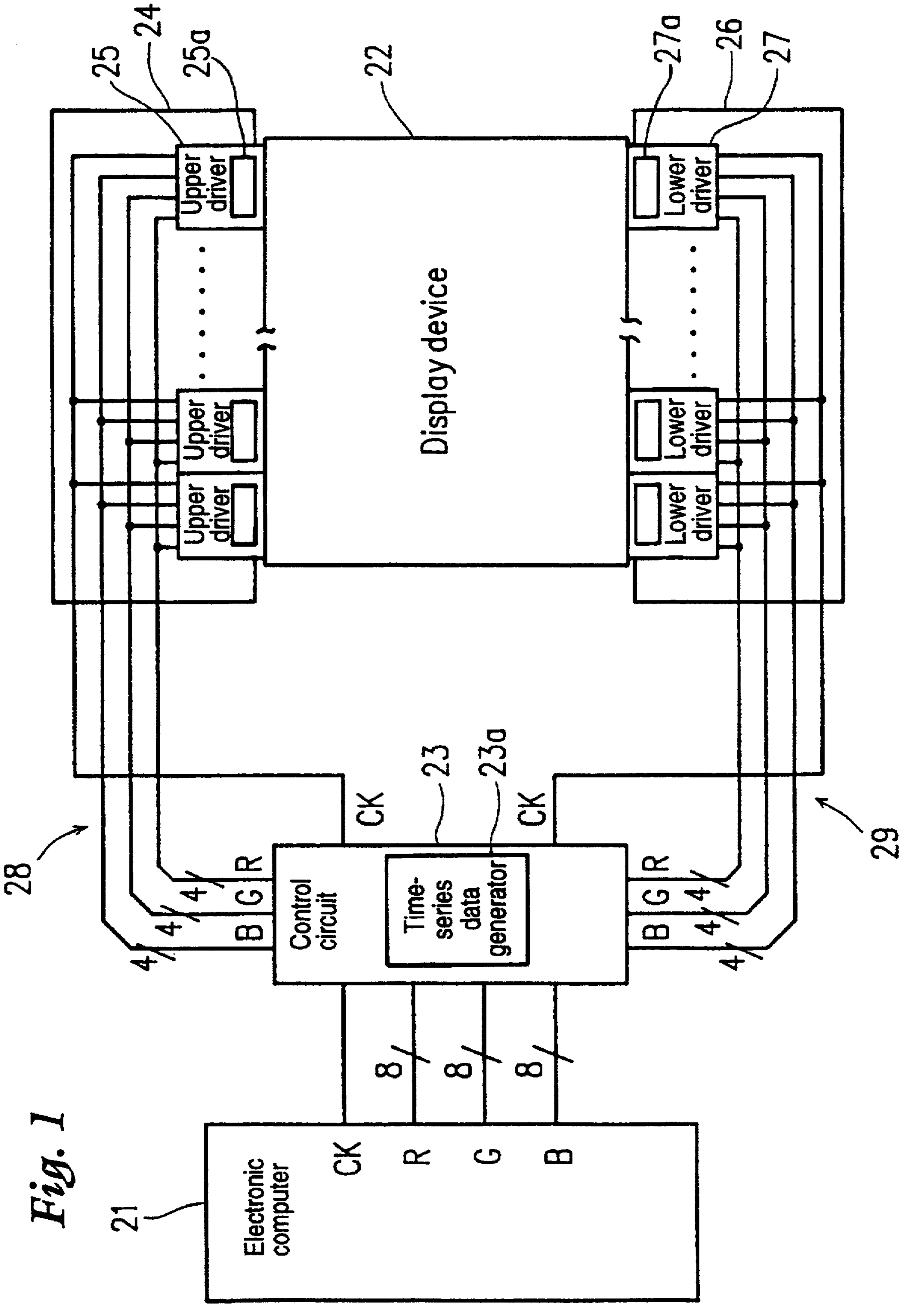
FIG. 1 is a block diagram showing the construction of a display driving device in one example of the invention.

FIG. 1 shows a schematic diagram of data and a synchronization clock (a sampling clock) which is synchronized with the data in a display driving device in one example of the invention. To the display driving device, image data is applied in such a manner that data related to respective one of red (R), green (G), and blue (B) is represented by 8 bits. Herein, the present invention is not directly concerned with a scanning driver (a gate driver), other control signals, and a power supply, so that they are omitted in the description and the drawings.

In FIG. 1, an electronic computer 21 outputs a synchronization clock CK and display data such as 8-bit red (R) image data AR ($R_0$–$R_7$), 8-bit green (G) image data AG ($G_0$–$G_7$), and 8-bit blue (B) image data AB ($B_0$–$B_7$). The electronic computer 21 is connected to a control circuit 23. The control circuit 23 controls the display data so as to sort them into two sets of display data for upper and lower sections of a display screen of a liquid crystal display device 22. The control circuit 23 also divides the image data for each color into pairs each composed of one of upper bits and one of lower bits, and formats them in a time-series manner, so as to generate time-series data. Specifically, as for red image data, the bits $R_0$–$R_7$ are divided into pairs each composed of one of upper bits ($R_4$–$R_7$) and one of lower bits ($R_0$–$R_3$), e.g., pairs of $R_0$ and $R_4$, $R_1$ and $R_5$, $R_2$ and $R_6$, and $R_3$ and $R_7$. The control circuit 23 is connected to an upper-side driver 25 provided on an upper-side driver substrate 24 and a lower-side driver 27 provided on a lower-side driver substrate 26 via transmission line sets 28 and 29, respectively. Through the transmission line sets 28 and 29, the time-series data and the synchronization clock from the control circuit 23 are transmitted to the upper-side driver 25 and the lower-side driver 27, respectively. The upper-side driver 25 and the lower-side driver 27 are connected to the display device 22. The drivers 25 and 27 drive the display device 22 by using the display data, so as to display an image.

With the above-described construction, the 8-bit R, G, and B image data AR ($R_0$–$R_7$), AG ($G_0G_7$), and AB ($B_0$–$B_7$) fed to the control circuit 23 together with the synchronization clock CK from the electronic computer 21 are sorted into two sets of data for the upper-side and the lower-side drivers 25 and 27, and divided into pairs of upper bits and lower bits by the control circuit 23 which then formats the pairs of image data in the time-series manner. The resultant time-series data sets are transmitted to the upper-side and the lower-side drivers 25 and 27 via upper-side and lower-side data lines (data bus), respectively. In general, in each of the transmission line sets 28 and 29 from the control circuit 23 to the drivers 25 and 27, a line is provided per bit. For example, in a driving circuit for 8-bit data, it is necessary to provide 24 lines only for the image data of red (R), green (G), and blue (B). However, in this example, among the time-series data sets which are obtained by dividing the image data into pairs of upper bits and lower bits and formatting them in the time-series manner, time-series data of a pair of an upper bit and a lower bit is commonly transmitted through one and the same data line. Thus, the number of transmission lines can be halved. It is appreciated that, in the cases where a driver is installed on either of the upper side or the lower side, the signal sorting in accordance with the upper and lower display positions by the control circuit 23 is not performed.

Figure 2:
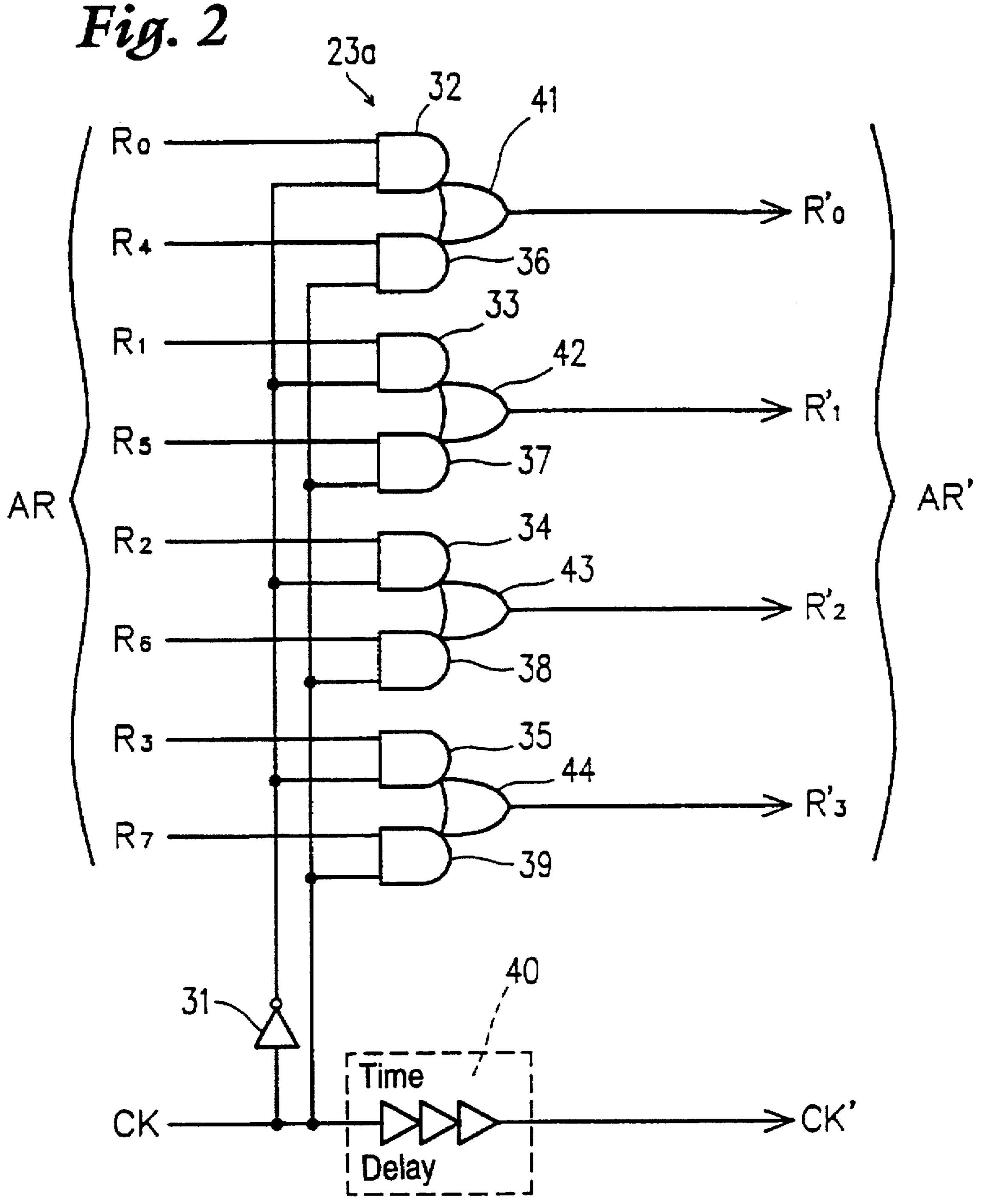
FIG. 2 is a circuit diagram of the time-series data generator 23*a* in the control circuit 23 shown in FIG. 1.

FIG. 2 shows the circuitry of a time-series data generator 23*a* in the control circuit 23 shown in FIG. 1. Circuits for red. (R), green (G), and blue (B) are identical with each other, so that FIG. 2 shows only the circuit for red (R).

In FIG. 2, the input terminal of the synchronization clock CK is connected to one of two input terminals of each of logical-AND circuits (in this example, AND gates) 32, 33, 34, and 35 via an inverter 31. The input terminal of the synchronization clock CK is directly connected to one of two input terminals of each logical-AND circuit (in this example, each AND gate) 36, 37, 38, and 39. In addition, the input terminal of the synchronization clock CK is connected to a transmission line for a synchronization clock CK' via a delay circuit 40.

It is assumed that the 8-bit red (R) image data AR ($R_0$–$R_7$) has upper bits $R_4$–$R_7$ and lower bits $R_0$–$R_3$. The lower bit $R_0$ is connected to the other input terminal of the AND gate 32, and the upper bit $R_4$ is connected to the other input terminal of the AND gate 36. Output terminals of these AND gates 32 and 36 are connected to input terminals of a logical-OR circuit (in this example, an OR gate) 41, and the OR gate 41 outputs time-series data $R_0$' through an output terminal thereof. Similarly, the lower bit $R_1$ is connected to the other input terminal of the AND gate 33, and the upper bit $R_5$ is connected to the other input terminal of the AND gate 37. Output terminals of these AND gates 33 and 37 are connected to input terminals of a logical-OR circuit (in this case, an OR gate) 42, and the OR gate 42 outputs time-series data $R_1$' through an output terminal thereof. Similarly, the lower bit $R_2$ is connected to the other input terminal of the AND gate 34, and the upper bit $R_6$ is connected to the other input terminal of the AND gate 38. Output terminals of these AND gates 34 and 38 are connected to input terminals of a logical-OR circuit (in this example, an OR gate) 43, and the OR gate 43 outputs time-series data $R_2$' through an output terminal thereof. Similarly, the lower bit $R_3$ is connected to the other input terminal of the AND gate 35, and the upper bit $R_7$ is connected to the other input terminal of the AND gate 39. Output terminals of these AND gates 35 and 39 are connected to input terminals of a logical-OR circuit (in this example, an OR gate) 44, and the OR gate 44 outputs time-series data $R_3$' through an output terminal thereof. The time-series data generator 23*a* is constructed in the above-described manner.

Hereinafter, the operation of the time-series data generator 23*a* having the above-described construction will be described.

During the high-level period of the synchronization clock CK, the upper bits $R_4$–$R_7$ pass through the AND gates 36, 37, 38, and 39, and are output from the output terminals of the OR gates 41, 42, 43, and 44, respectively. Thereafter, during the low-level period of the synchronization clock CK, the lower bits $R_0$–$R_3$ pass through the AND gates 32, 33, 34, and 35, and are output from the output terminals of the OR gates 41, 42, 43, and 44, respectively. In this way, the format of the image data AR is converted, so as to output the time-series data AR'.

Figure 3:
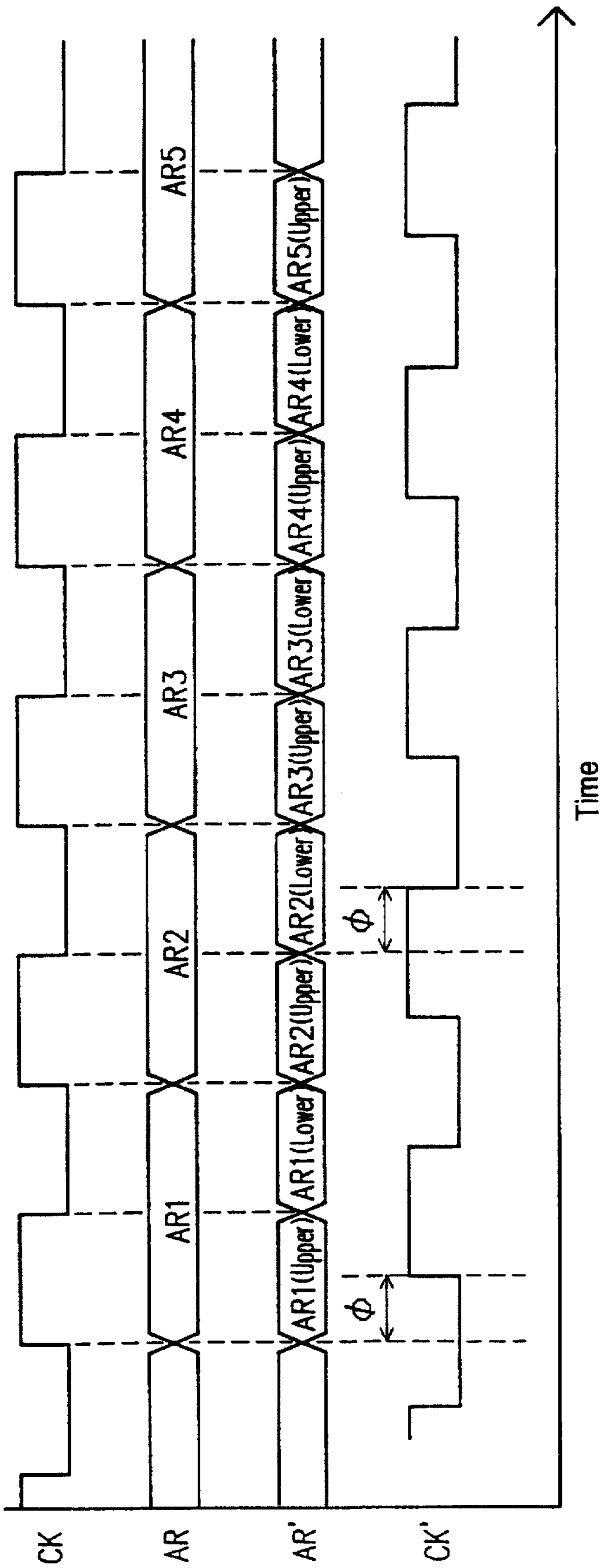
FIG. 3 is a waveform chart illustrating the timings of format conversion of red data in the time-series data generator 23*a* in FIG. 2.
Figure 4:
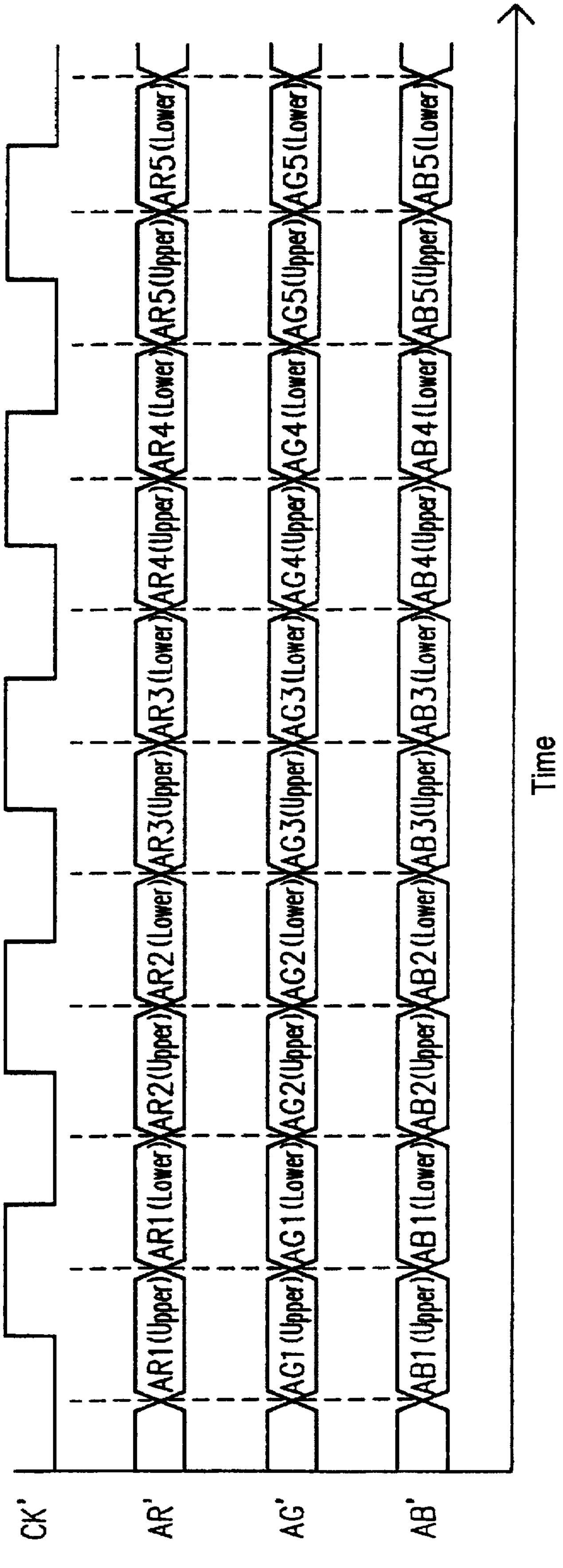
FIG. 4 is a waveform chart illustrating the timings of format conversion of red, green, and blue data in the time-series data generator 23*a* in FIG. 2.

FIG. 3 shows the timings of format conversion of the red data in the time-series data generator 23*a* shown in FIG. 2. As shown in FIG. 3, the transmitted first red image data AR1 is sorted into an upper-bit data set AR1(UPPER) and a lower-bit data set AR1(LOWER), and results in the time-series data AR' in which pairs of upper bits and lower bits are formatted in the time-series manner. Specifically, the upper-bit data set AR1(UPPER) corresponds to $R_4$–$R_7$, the lower-bit data set AR1(LOWER) corresponds to $R_0$–$R_3$, and the time-series data AR' after the format conversion corresponds to $R_0$'–$R_3$'. The synchronization clock CK' output from the delay circuit 40 has a phase difference $\phi$ with respect to the synchronization clock CK. This is because the phase of the synchronization clock CK is delayed by the phase difference $\phi$ in the delay circuit 40. The phase difference $\phi$ is not necessarily set so that the rising and falling edges of the synchronization clock CK' are positioned at the center of the time-series data as shown in FIG. 3, and the phase difference $\phi$ is sufficient as long as it ensures that data can be latched in the drivers 25 and 27. In the same way, the format of the green (G) and blue (B) image data AG and AB is converted, so as to generate time-series data AG' and AB'. The format conversion is shown in FIG. 4.

Figure 5:
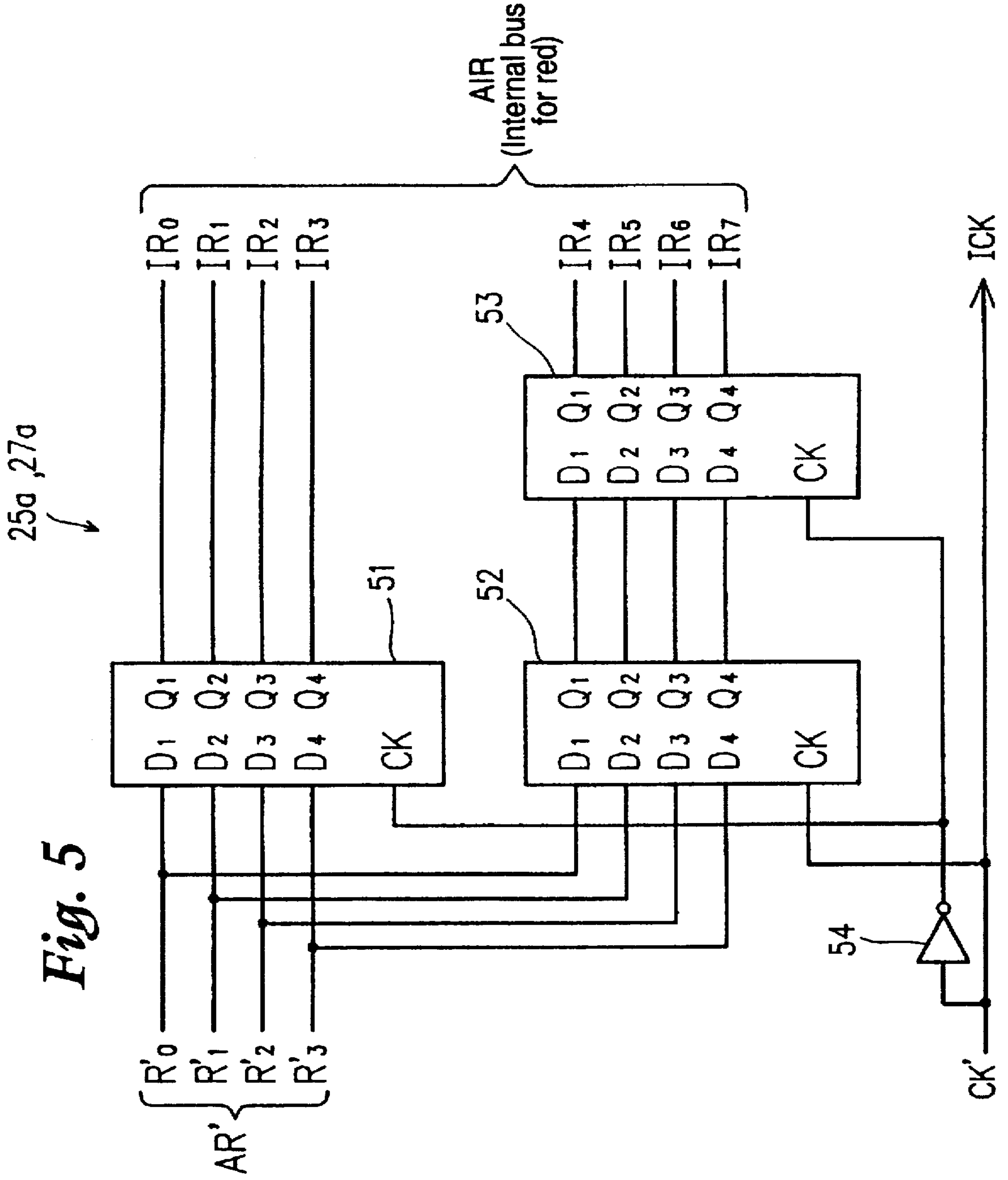
FIG. 5 is a circuit diagram of the image data demodulators 25*a* and 27*a* in the drivers 25 and 27 shown in FIG. 1.

FIG. 5 shows the circuitry of the image data demodulators 25*a* and 27*a* in the drivers 25 and 27 shown in FIG. 1. In FIG. 5, the input ends for the time-series data $R_0$'–$R_3$' are connected to input terminals $D_1$–$D_4$ of D-type flip-flops 51 and 52, respectively. Output terminals $Q_1$–$Q_4$ of the flip-flop 52 are connected to input terminals $D_1$–$D_4$ of a D-type flip-flop 53, respectively. The input end for the synchronization clock CK' is connected to a clock input terminal of the flip-flop 52. The input end for the synchronization clock CK' is connected to clock input terminals of the flip-flops 51 and 53 via an inverter 54. Each of the image data demodulators 25*a* and 27*a* is constructed in the above-described manner. From the time-series data AR' ($R_0$'–$R_3$'), the image data AR ($R_0$–$R_7$) is reconstructed, resulting in internal red image data AIR ($IR_0$–$IR_7$).

The operation of the image data demodulators 25*a* and 27*a* having the above-described construction will be described below. First, the time-series data AR' ($R_0$'–$R_3$') transmitted from the control circuit 23 through the transmission line sets 28 and 29 are input into the drivers 25 and 27 via the input terminals thereof through respective input buffer circuits.

As shown in FIG. 5, the synchronization clock CK' is an inverted synchronization clock via the inverter 54. The inverted synchronization clock and the time-series data AR' ($R_0$'–$R_3$') are input into the CK input terminal and the input terminals $D_1$–$D_4$ of the flip-flop 51, respectively. At the rising edge of the inverted synchronization clock (at the falling edge of the synchronization clock), the time-series data AR' ($R_0$'–$R_3$') are latched, and the internal lower-bit data $IR_0$–$IR_3$ of the lower four bits of the image data are output from the output terminals $Q_1$–$Q_4$ of the flip-flop 51, respectively. The synchronization clock CK' and the time-series data AR' ($R_0$'–$R_3$') are input to the CK input terminal and the input terminals $D_1$–$D_4$ of the flip-flop 52, respectively. At the rising edge of the synchronization clock CK', the upper-bit data of the time-series data AR' ($R_0$'–$R_3$') are latched once. The upper-bit data of the time-series data AR' ($R_0$'–$R_3$') are latched in the flip-flop 53 at the rising edge of the inverted synchronization clock, and the internal upper-bit data $IR_4$–$IR_7$ of the upper four bits of the image data are output from the output terminals $Q_1$–$Q_4$ of the flip-flop 53, respectively. In this way, the image data AR ($R_0$–$R_7$) is reconstructed, resulting in internal red image data AIR ($IR_0$–$IR_7$).

Figure 6:
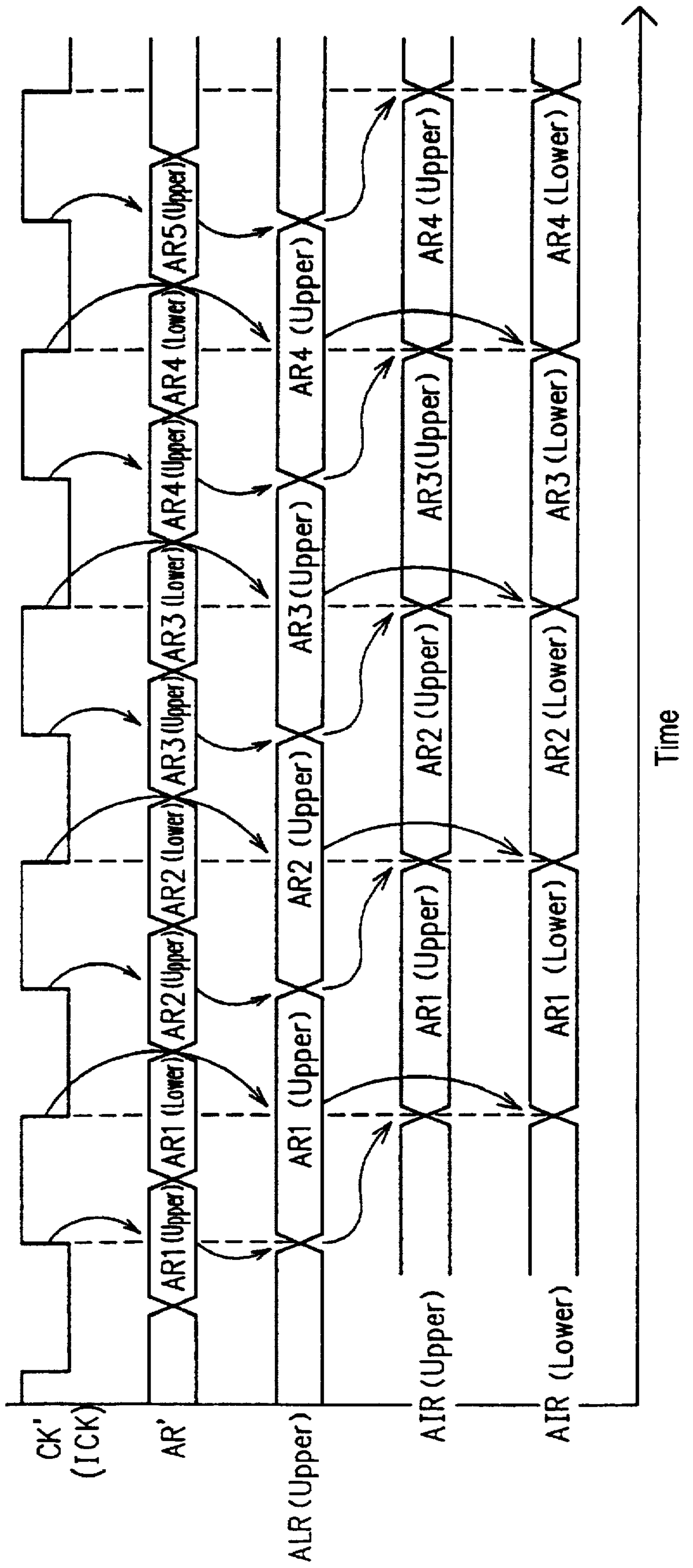
FIG. 6 is a waveform chart illustrating the timings of format conversion of red data in the image data demodulators 25*a* and 27*a* shown in FIG. 5.

FIG. 6 shows the timings of format conversion of the red data in the image data demodulators 25*a* and 27*a*. As shown in FIG. 6, the upper-bit data AR1(UPPER) of the red image data AR1 which is first transmitted is latched in the flip-flop 52 at the rising edge of the synchronization clock CK', and output as the upper-bit data AR1(UPPER). Then, the lower-bit data AR1(LOWER) of the red image data AR1 which is transmitted next is latched in the flip-flop 51 at the falling edge of the synchronization clock CK', and output as the lower-bit internal image data AIR1(LOWER). At the same time, the upper-bit data AR1(UPPER) output from the flip-flop 52 is latched in the flip-flop 53 at the falling edge of the synchronization clock CK', and output as the upper-bit internal image data AIR1(UPPER). In this way, for the red data, the format of the time-series data AR' is converted and reconstructed into the internal image data AIR. Similarly, for the green.(G) and blue (B) image data AG and AB, the formats of the time-series data AG' and AB' are converted and reconstructed into internal image data AIG and AIB.

Therefore, for example, in the case where the 8-bit red image data is sorted into a set of upper four bits ($R_4$–$R_7$) and a set of lower four bits ($R_0$–$R_3$), and further divided, for example, into pairs of: $R_0$ and $R_4$; $R_1$ and $R_5$; $R_2$ and $R_6$; and $R_3$ and $R_7$, each pair is commonly transmitted through one and the same transmission line in such a state that respective bit data is arranged in the time-series manner. Accordingly, it is possible to reduce the number of data lines included in the transmission line sets 28 and 29 for data transfer from the control circuit 23 to the drivers 25 and 27 to be half. The display driving device can be more desirably and freely designed as a module. Also, the number of input terminals of the drivers 25 and 27 can be reduced, so that the pitch of the input terminals (i.e., intervals between terminals) of the drivers 25 and 27 can be increased. Thus, the mechanical strength can be improved, and the installation can be facilitated. Consequently, the mass-productivity of modules can be improved. Associated with the above-mentioned effects, the number of terminals of an LSI which constitutes the control circuit can be reduced, which advantageously results in the reduction of cost and the facilitation of installation.

In the image data demodulators 25*a* and 27*a* in this example, the data latch is performed by utilizing the timings of both the rising edge and the falling edge of the synchronization clock CK'. However, according to this method, as the data transfer rate is increased, it becomes difficult to keep the duty ratio of the synchronization clock precise, so that it becomes difficult to attain the high-speed operation.

Figure 7:
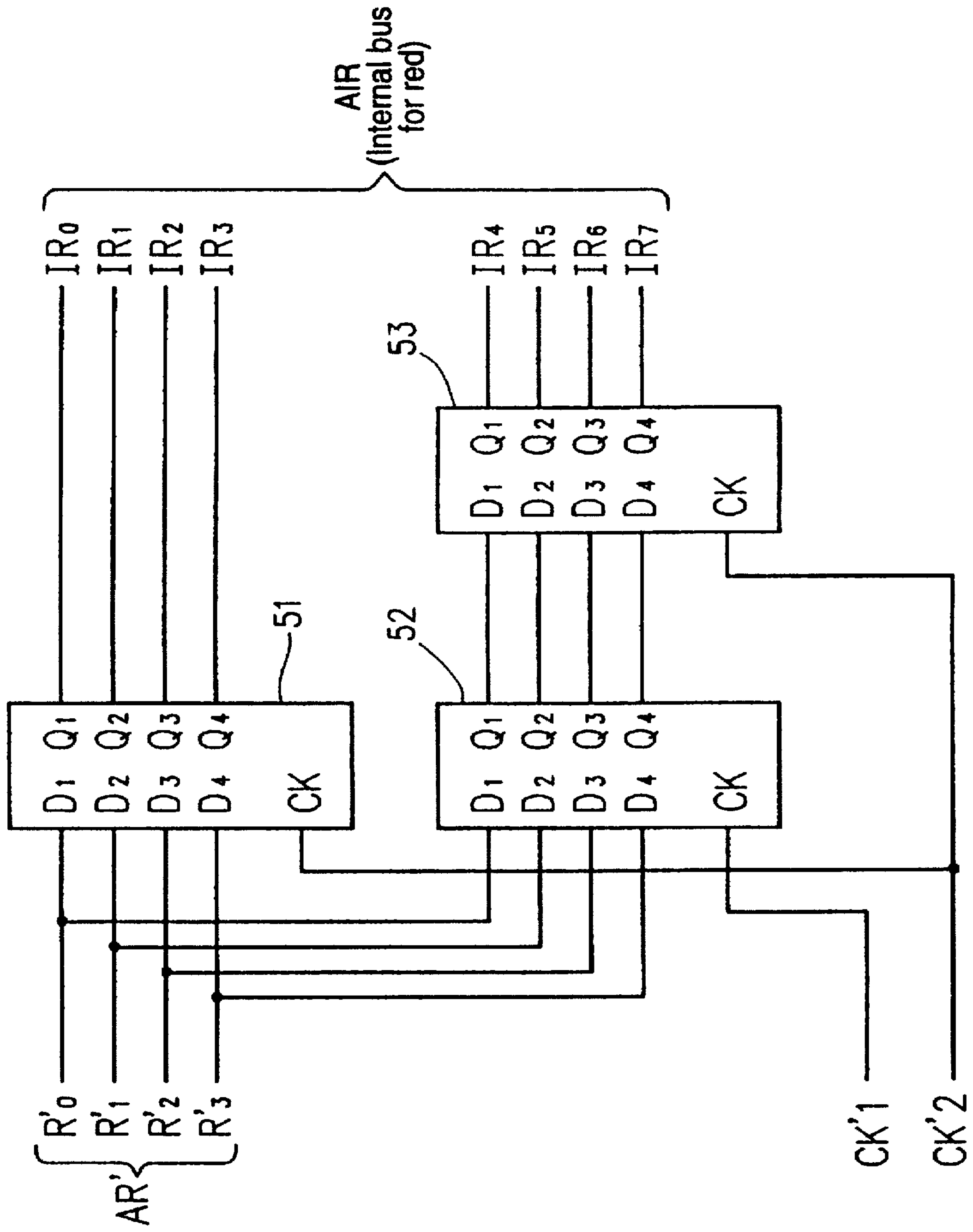
FIG. 7 is a circuit diagram of image data demodulators 25*a* and 27*a* in a display driving device in another example of the invention.
Figure 8:
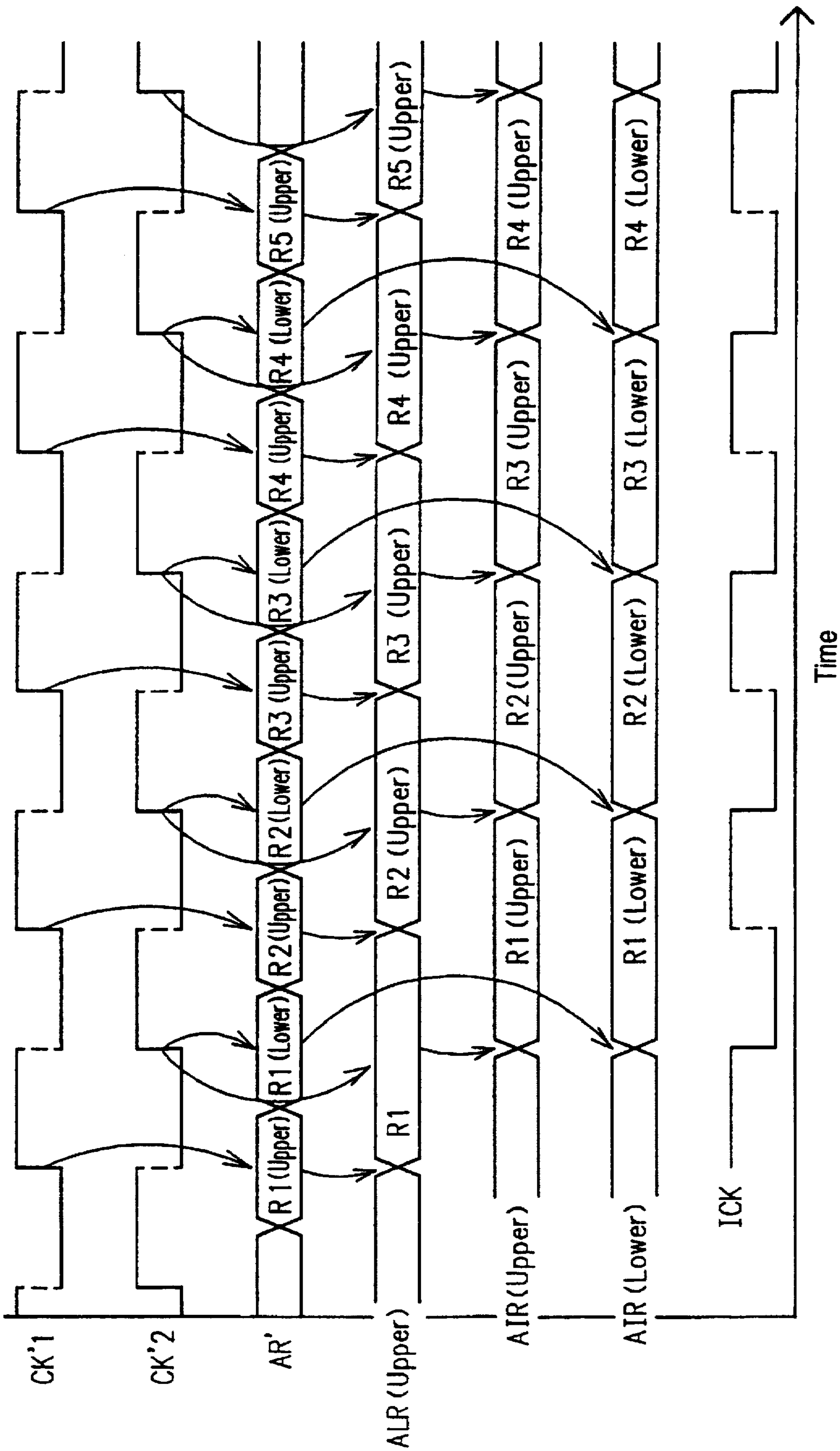
FIG. 8 is a waveform chart illustrating the timings of format conversion of red data in the image data demodulator shown in FIG. 7.
Figure 9:
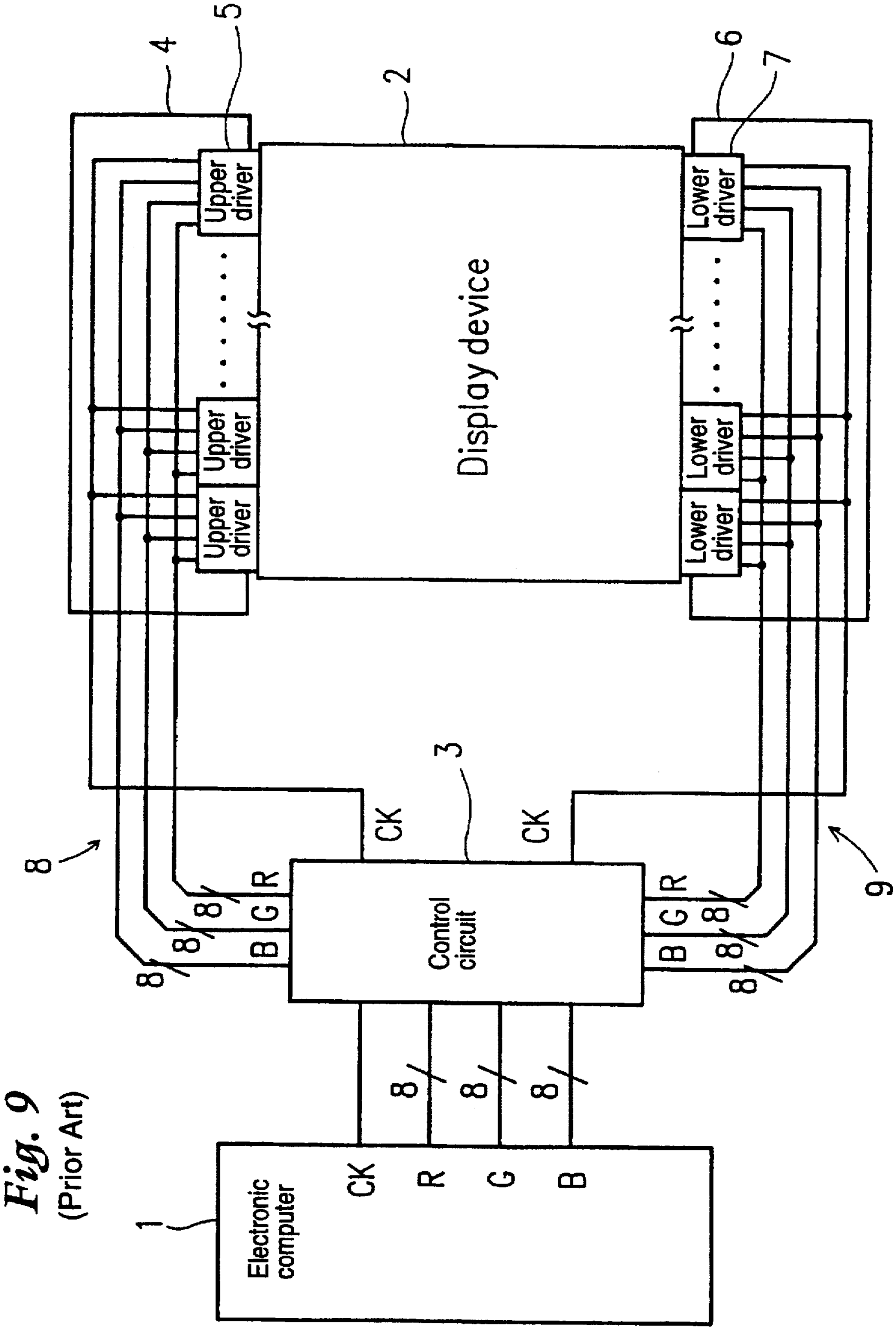
Fig. 9 (Prior Art)
FIG. 9 is a block diagram showing the construction of a conventional display driving device.
Figure 10:
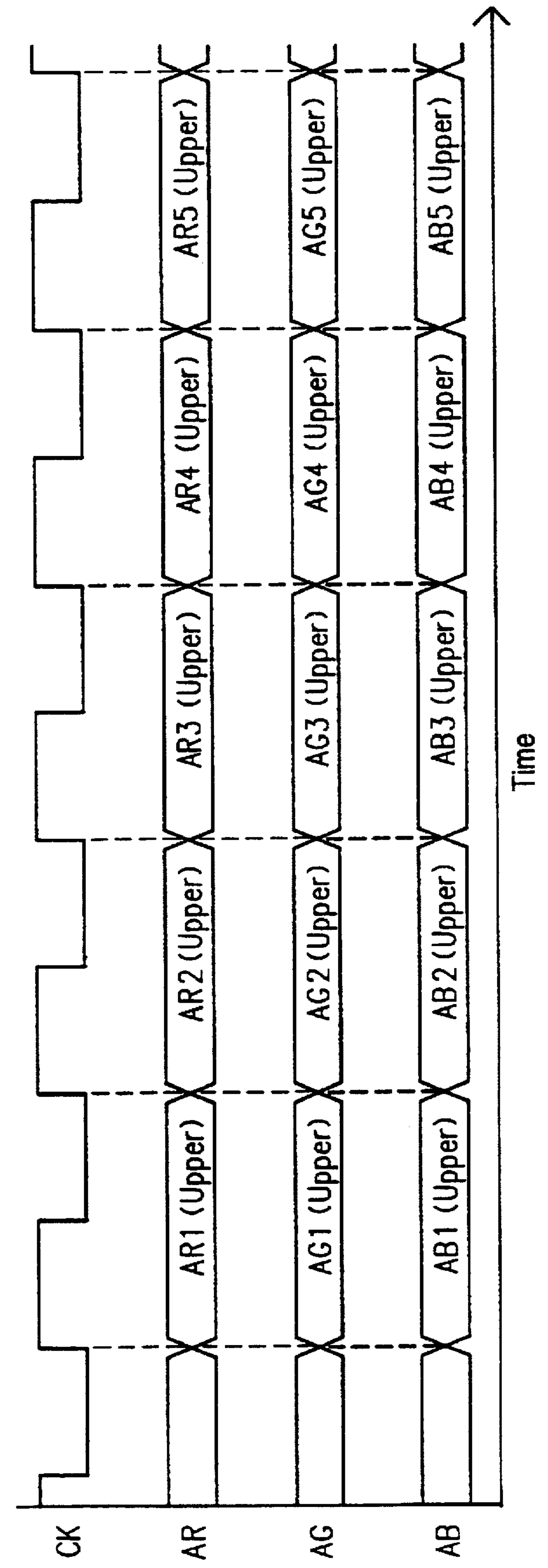
Fig. 10 (Prior Art)
FIG. 10 is a waveform chart illustrating the timings of transmission of a synchronization clock and image data transmitted to the driver 5 shown in FIG. 9.
Figure 11:
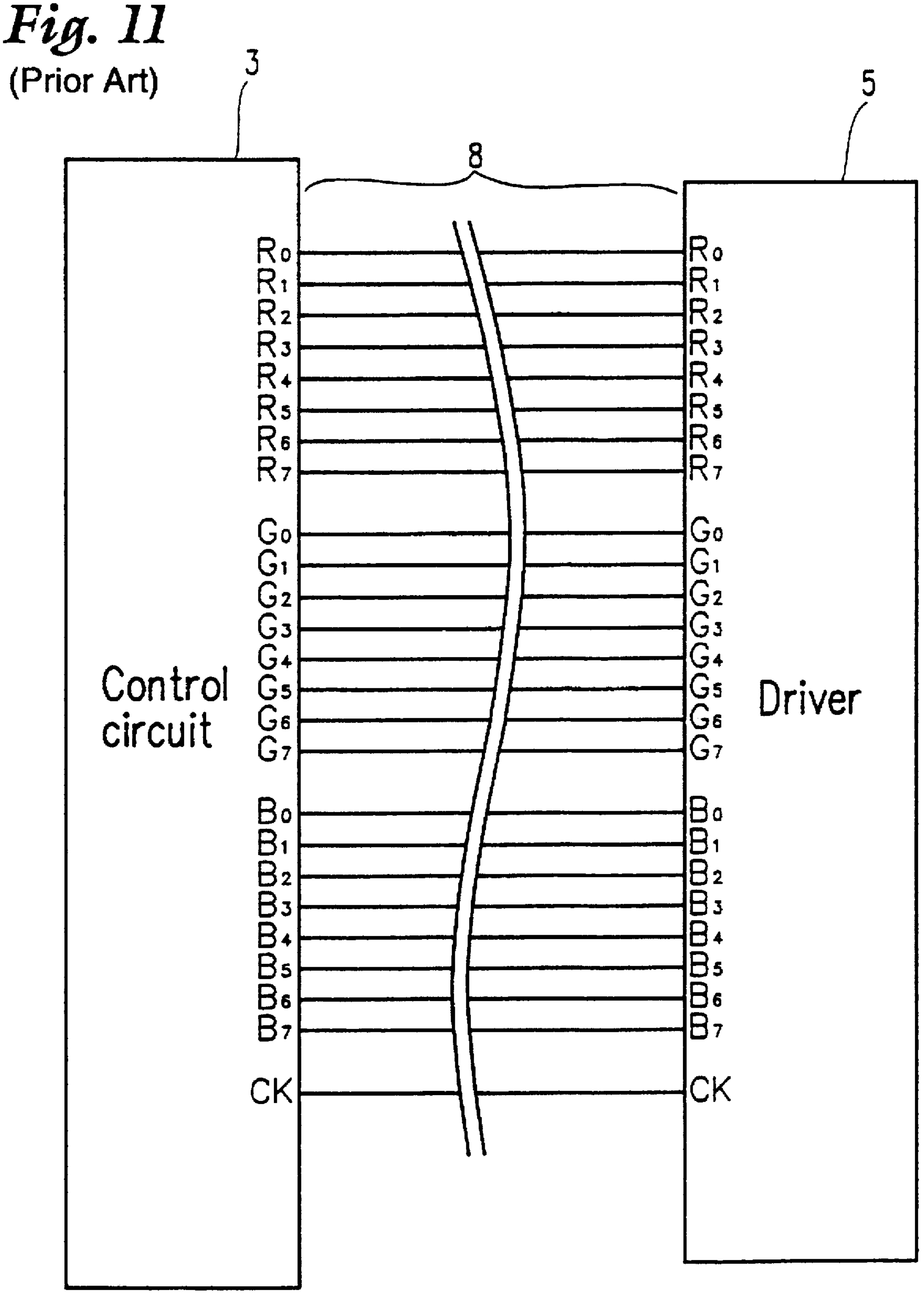
Fig. 11 (Prior Art)
FIG. 11 is a diagram showing the connection relationship between the control circuit 3 and the driver 5 shown in FIG. 9.
Figure 12:
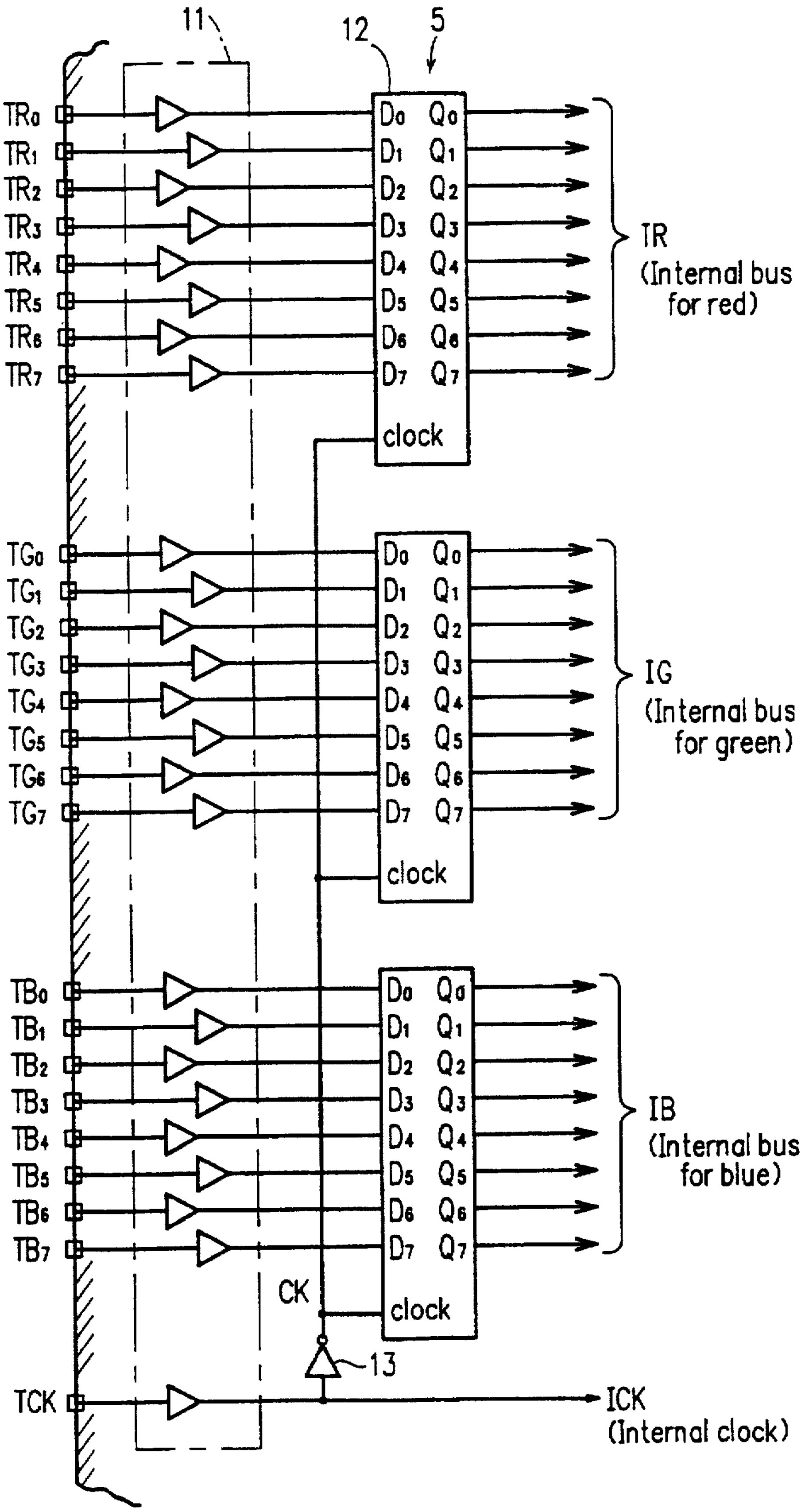
Fig. 12 (Prior Art)
FIG. 12 is a circuit diagram of a data input section in the driver 5 shown in FIG. 9.
Figure 13:
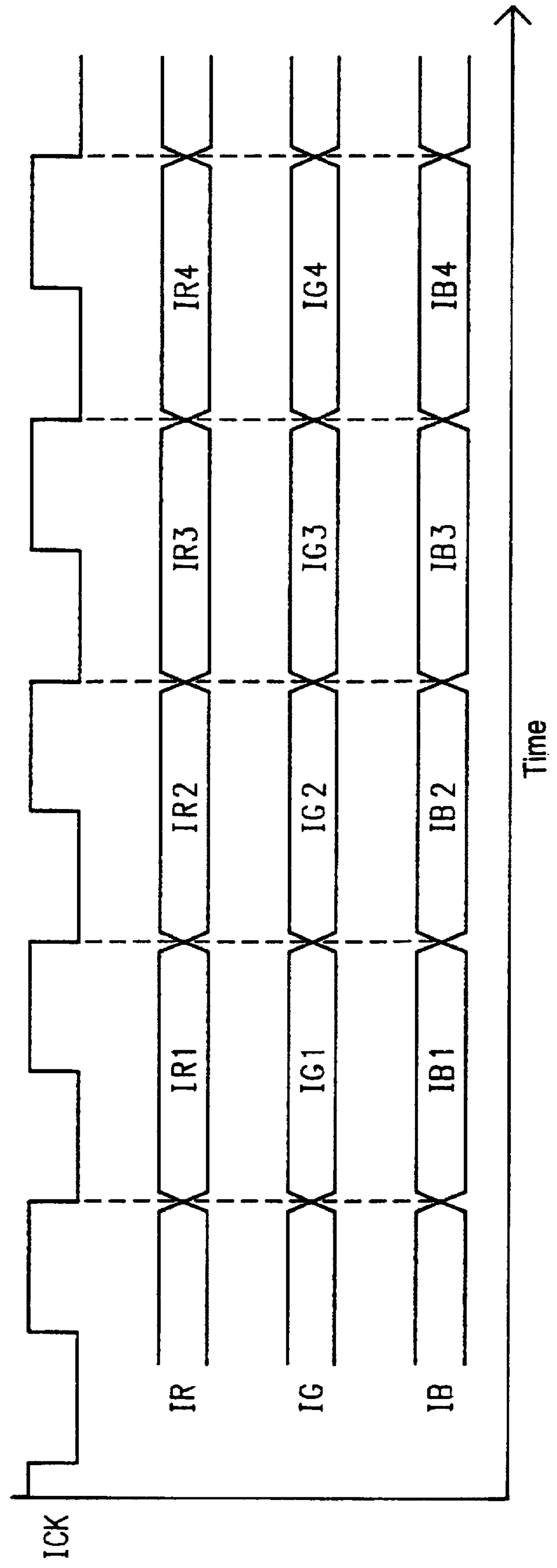
Fig. 13 (Prior Art)
FIG. 13 is a waveform chart illustrating the timings of transmission of an internal synchronization clock and internal image data through internal bus in the driver 5 shown in FIG. 9.

In order to overcome the disadvantage, as shown in the circuit diagram of the image data demodulator in FIG. 7 and the operation timing diagram in FIG. 8, two synchronization clocks are provided. That is, there are two synchronization clocks: a first clock CK'1 which indicates the latch timing of the upper-bit data R1(UPPER) of the time-series data AR'; and a second clock CK'2 which indicates the latch timing of the lower-bit data R1(LOWER) of the time-series data AR'. The timing of either one of the rising edge or the falling edge of each of the synchronization clocks CK'1 and CK'2 is used. In this case, the synchronization clocks CK'1 and CK'2 can be independently adjusted irrespective of the duty ratios thereof. Accordingly, high-speed data transfer and sampling can be easily performed. In this case, the two synchronization clocks are used only for the data latch, and only one of the two synchronization clocks is sufficient for the other operations of the driver. In this case, the rising of the synchronization clock CK'2 finally determines the timing of the internal bus, so that an inverted signal of the synchronization clock CK'2 is used as the internal clock. The case has a drawback in that the number of transmission lines from the control circuit to the driver is increased by 1. However, for example in the case of the 8-bit data, the number of the transmission lines in the example shown in FIGS. 1 through 6 is reduced by 12 lines, as compared with the conventional case. Even if a line is additionally provided, the number of the transmission lines is reduced by 11 lines, as compared with the conventional case, and the effect is sufficiently attained. In FIG. 8, broken line shows a portion in which the timing can be allowed to be indefinite.

In this example, the 8-bit image data is used for each color. If image data of 4 bits or more is used, the effects of the present invention can be more greatly attained. In addition, in the image data demodulators 25*a* and 27*a* in this example, the image data is reconstructed from the time-series data. However, the time-series data can be directly used for the display driving. Moreover, the time-series data of this example is obtained by dividing the image data into the upper-bit data set and the lower-bit data set, and then by arranging the data sets in a time-series manner. However, the number of divided sets can be desirably selected.

As described above, the time-series data obtained by dividing the image data and arranging them in the time-series manner is transmitted through a common transmission line, so that the increase in number of data lines and the increase in number of input terminals of the driver with the increase in number of bits can be suppressed. Thus, it is possible to provide a display driving device capable of being mass-produced, and a display driving method used in the device. Moreover, in the case Where the rising and the falling of the synchronization clock is used as the latch timing information for the time-series data which are transmitted in the time-division and time-series manner, one transmission line can be omitted. In another case where separate synchronization clocks are used for providing the latch timing information for the time-series data which are transmitted in the time-division and time-series manner, one transmission line is added, but the synchronization clocks can be independently adjusted irrespective of the duty ratios thereof. Therefore, the high-speed data transfer and sampling can be easily performed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display driving device having a display driver for driving a display device by image data to perform a display, the display driving device comprising:

a time-series data generating section for arranging division data obtained by dividing the image data in a time-series manner, to generate time-series data; and transmission lines provided between the time-series data generating section and the display driver through which the time-series data is transmitted from the time-series data generating section in which data representing an image color component is transmitted on two or more data lines and each data line has two or more serial bits per line.

2. A display driving device according to claim 1, wherein:

the display device is divided into a plurality of display areas, and a plurality of the display drivers are provided in order to drive the display areas.

3. A display driving device having a display driver for driving a display device by image data to perform a display, the display driving device comprising:

a time-series data generating section for arranging division data obtained by dividing the image data in a time-series manner, to generate time-series data;

transmission lines provided between the time-series data generating section and the display driver through which the time-series data is transmitted from the time-series data generating section in which data representing an image color component is transmitted on two or more data lines and each data line has two or more serial bits per line, and an image data demodulating section provided in the display driver, for receiving the time-series data from the transmission lines and for reconstructing the image data from the time-series data.

4. A display driving device according to claim 3, wherein.

the display device is divided into a plurality of display areas, and a plurality of the display drivers are provided in order to drive the display areas.

5. A display driving device having a display driver for driving a display device by image data composed of a plurality of bits to perform a display, the display driving device comprising:

a time-series data generating section for dividing the plurality of bits of the image data into pairs, each pair including at least an upper bit and a lower bit and for arranging the upper bit and the lower bit in a time-series manner for each of the pairs, to generate time-series data; and transmission lines provided between the time-series data generating section and the display driver through which the time-series data is transmitted one pair per line from the time-series data generating section wherein the number of transmission lines for transmitting the time series data is less than the number of bits in the plurality of bits.

6. A display driving device according to claim 5, wherein.

the display device is divided into a plurality of display areas, and a plurality of the display drivers are provided in order to drive the display areas.

7. A display driving device according to claim 5, wherein the time-series data generating section includes at least one logic portion including:

a first AND gate receiving upper-bit data and a synchronization clock;

a second AND gate receiving lower-bit data and an inverted synchronization clock; and an OR gate receiving outputs of the first and the second AND gates.

8. A display driving device having a display driver for driving a display device by image data to perform a display, the display driving device comprising:

a time-series data generating section for arranging division data obtained by dividing the image data in a time-series manner, to generate time-series data;

transmission lines provided between the time-series data generating section and the display driver through which the time-series data is transmitted from the time-series data generating section in which data is sent on two or more data lines and two or more serial bits per line are transmitted on each data line, and an image data demodulating section provided in the display driver, for receiving the time-series data from the transmission lines and for reconstructing the image data from the time-series date; and wherein the image data demodulating section includes:

a first flip-flop for receiving an inverted synchronization clock and time-series data and for latching the time-series data at the inverted synchronization clock, to acquire respective lower-bit data of the image data;

a second flip-flop for receiving a synchronization clock and the time-series data and for latching the time-series data at the synchronization clock, to acquire respective upper-bit data of the image data; and a third flip-flop for receiving the inverted synchronization clock and the time-series data and for latching the upper-bit data from the second flip-flop at the inverted synchronization clock, to acquire respective upper-bit data of the image data.

9. A display driving device having a display driver for driving a display device by image data to perform a display, the display driving device comprising:

a time-series data generating section for arranging division data obtained by dividing the image data in a time-series manner, to generate time-series data;

transmission lines provided between the time-series data generating section and the display driver through which the time-series data is transmitted from the time-series data generating section in which data is sent on two or more data lines and two or more serial bits per line are transmitted on each data line, and an image data demodulating section provided in the display driver, for receiving the time-series data from the transmission lines and for reconstructing the image data from the time-series date; and wherein the image data demodulating section includes:

a first flip-flop for receiving a first synchronization clock which applies a latch timing of upper-bit data and time-series data and for latching the time-series data at the first synchronization clock, to acquire respective upper-bit data of the image data;

a second flip-flop for receiving a second synchronization clock which applies a latch timing of lower-bit data and the time-series data and for latching the time-series data at the second synchronization clock, to acquire respective lower-bit data of the image data; and a third flip-flop for receiving the second synchronization clock and the time-series data and for latching the upper-bit data from the first flip-flop at the second synchronization clock, to acquire respective upper-bit data of the image data.

10. A display driving device according to claim 5, wherein.

the plurality of bits are 8 bits, the 8 bits being $D_0$ to $D_7$, the 8 bits being divided into an upper-bit set of $D_4$ to $D_7$ and a lower-bit set of $D_O$ to $D_3$, and the bits in the upper-bit set and the lower-bit set are arranged into pairs of: $D_O$ and $D_4$; $D_1$ and $D_5$; $D_2$ and $D_6$; and $D_3$ and $D_7$.

* * * * *